(12) United States Patent
Saikaku et al.

(10) Patent No.: US 10,374,079 B2
(45) Date of Patent: Aug. 6, 2019

(54) SILICON CARBIDE SEMICONDUCTOR DEVICE AND METHOD FOR MANUFACTURING SAME

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Hirotaka Saikaku, Kariya (JP); Jun Sakakibara, Kariya (JP); Shoji Mizuno, Kariya (JP); Yuichi Takeuchi, Kariya (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 42 days.

(21) Appl. No.: 15/505,267

(22) PCT Filed: Sep. 8, 2015

(86) PCT No.: PCT/JP2015/004569
§ 371 (c)(1),
(2) Date: Feb. 21, 2017

(87) PCT Pub. No.: WO2016/042738
PCT Pub. Date: Mar. 24, 2016

(65) Prior Publication Data
US 2017/0263757 A1  Sep. 14, 2017

(30) Foreign Application Priority Data

Sep. 16, 2014 (JP) .................................. 2014-187946
May 29, 2015 (JP) .................................. 2015-110167

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0688* (2013.01); *H01L 29/0878* (2013.01);
(Continued)

(58) Field of Classification Search
CPC ............. H01L 29/7813; H01L 29/4236; H01L 29/7827; H01L 29/1095; H01L 29/1608;
(Continued)

(56) References Cited

U.S. PATENT DOCUMENTS 5,895,939 A    4/1999  Ueno
5,963,807 A   10/1999  Ueno
(Continued)

FOREIGN PATENT DOCUMENTS

JP    2008-060152 A    3/2008
JP    2010-258386 A   11/2010
(Continued)

*Primary Examiner* — Monica D Harrison
*Assistant Examiner* — John Lin
(74) *Attorney, Agent, or Firm* — Posz Law Group, PLC

(57) ABSTRACT

A silicon carbide semiconductor device includes: a substrate; a drift layer over the substrate; a base region over the drift layer; multiple source regions over an upper layer portion of the base region; a contact region over the upper layer portion of the base region between opposing source regions; multiple trenches from a surface of each source region to a depth deeper than the base region; a gate electrode on a gate insulating film in each trench; a source electrode electrically connected to the source regions and the contact region; a drain electrode over a rear surface of the substrate; and multiple electric field relaxation layers in the drift layer between adjacent trenches. Each electric field
(Continued)

relaxation layer includes: a first region at a position deeper than the trenches; and a second region from a surface of the drift layer to the first region.

8 Claims, 15 Drawing Sheets

(51) Int. Cl.
    *H01L 29/10*     (2006.01)
    *H01L 29/16*     (2006.01)
    *H01L 29/66*     (2006.01)
    *H01L 29/08*     (2006.01)
    *H01L 21/04*     (2006.01)

(52) U.S. Cl.
    CPC ...... *H01L 29/1095* (2013.01); *H01L 29/1608* (2013.01); *H01L 29/66068* (2013.01); *H01L 21/046* (2013.01); *H01L 21/047* (2013.01); *H01L 29/0886* (2013.01)

(58) Field of Classification Search
    CPC . H01L 29/0878; H01L 29/36; H01L 29/0623; H01L 27/2454
    See application file for complete search history.

(56) References Cited

U.S. PATENT DOCUMENTS

| | | |
|---|---|---|
| 2007/0032092 A1 | 2/2007 | Shibata et al. |
| 2008/0099837 A1* | 5/2008 | Akiyama ............ H01L 29/0623 257/341 |
| 2009/0200559 A1* | 8/2009 | Suzuki ................ H01L 29/0623 257/77 |
| 2011/0024831 A1 | 2/2011 | Nakano |
| 2012/0037920 A1 | 2/2012 | Treu et al. |
| 2012/0319136 A1* | 12/2012 | Noborio .............. H01L 29/1095 257/77 |
| 2013/0001680 A1 | 1/2013 | Nakano |
| 2014/0175459 A1 | 6/2014 | Yamamoto et al. |
| 2016/0005857 A1 | 1/2016 | Nakano |

FOREIGN PATENT DOCUMENTS

| | | |
|---|---|---|
| JP | 2012-069797 A | 4/2012 |
| JP | 2014-033223 A | 2/2014 |

\* cited by examiner

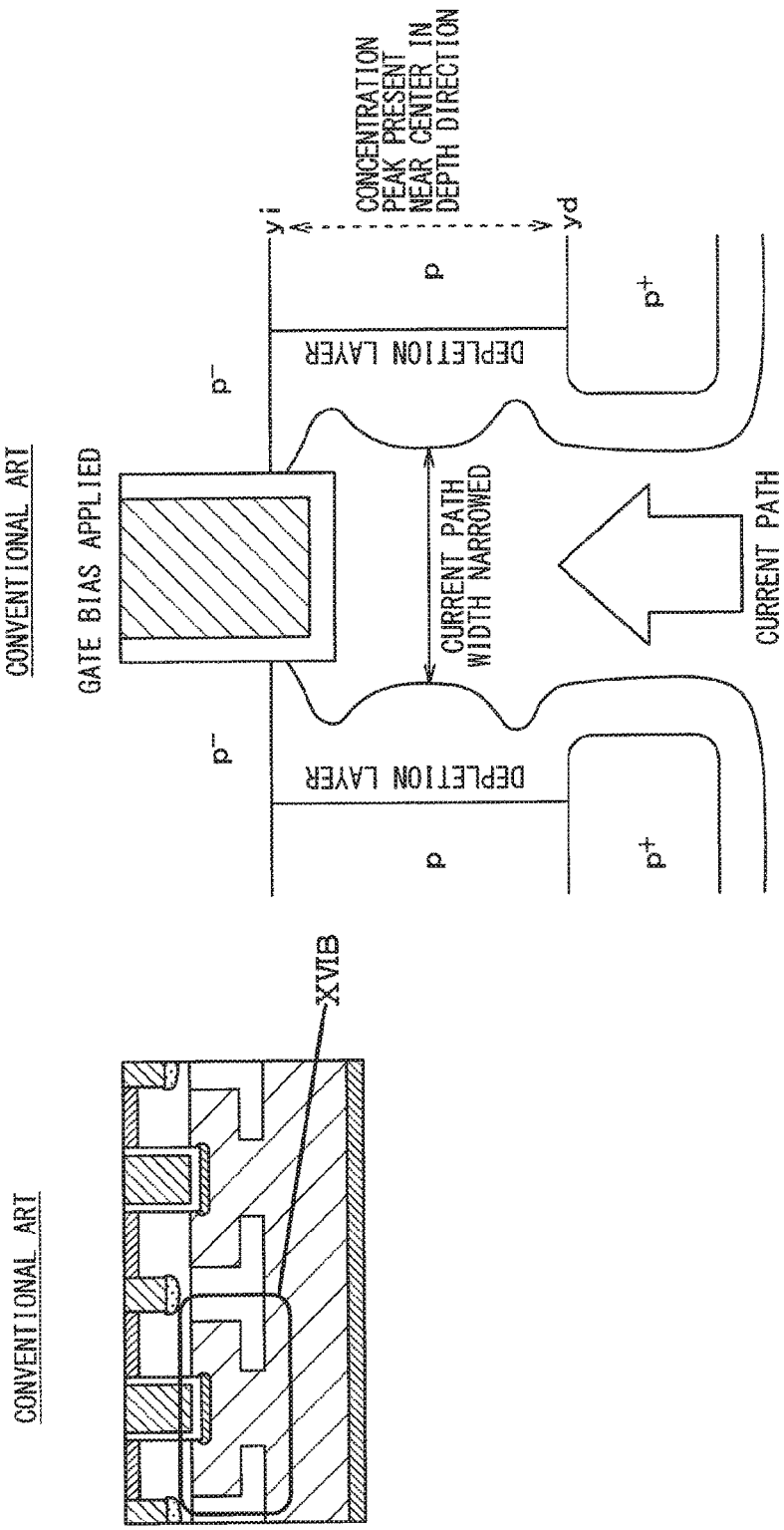

SILICON CARBIDE SEMICONDUCTOR DEVICE AND METHOD FOR MANUFACTURING SAME

CROSS REFERENCE TO RELATED APPLICATIONS

This application is a U.S. national stage application of International Patent Application No. PCT/JP2015/004569 filed on Sep. 8, 2015 and is based on Japanese Patent Applications No. 2014-187946 filed on Sep. 16, 2014, and No. 2015-110167 filed on May 29, 2015, the disclosures of which are incorporated herein by reference.

TECHNICAL FIELD

The present disclosure relates to a semiconductor device made of silicon carbide (hereinafter referred to as "SiC") with a trench gate structure, and a method of manufacturing the same.

BACKGROUND

Up to now, there is an SiC semiconductor device having a trench gate structure as a structure in which a channel density is increased to allow a large current to flow. In such a SiC semiconductor device having the trench gate structure, there is a possibility that a breakdown electric field strength of SiC is high, and a dielectric breakdown may occur by applying a high electric field to a bottom portion of a trench. For that reason, electric field relaxation layers of a single layer structure are formed below a base layer between opposing trench gates to relax an electric field, to thereby prevent a dielectric breakdown.

However, although the electric field relaxation effect to the trench gate portion is obtained with the provision of the electric field relaxation layer having the single layer structure, a depletion layer extends between the adjacent electric field relaxation layers to generate a JFET resistance region, resulting in such a problem that an on-resistance increases.

On the other hand, a MOSFET having a structure in which the electric field relaxation layers extend from a substrate surface to a deeper portion than the trench gate, lateral regions in which a width of the electric field relaxation layers is expanded in a lateral direction in the bottom portion are provided, and the lateral regions are arranged below the trench gate. With the above structure, since a carrier density in the drift layer can be lowered within a range sandwiched between the respective lateral regions, an electric field intensity distribution can be suppressed at a position deeper than the bottom portion of the trench and a withstand voltage characteristic can be improved. Furthermore, since an interval between the lateral regions is determined according to only formation positions of the lateral regions, the interval between the lateral regions can be prevented from being affected by a positional deviation caused by a manufacturing error of the trench gate and the electric field relaxation layers.

In the case of such a structure, the electric field relaxation layers extending from the surface of the substrate to the portion deeper than the trench gate are configured at the same concentration. However, because the electric field relaxation effects are not obtained if the electric field relaxation layers are formed at a low concentration, the electric field relaxation layers are formed at a high concentration. However, when the electric field relaxation layers are configured at the high concentration, the depletion layer from the electric field relaxation layers tends to extend in the vicinity of the trench, as a result of which a JFET resistance region is generated, which causes a problem that the on-resistance increases.

Under the circumstance, the SiC semiconductor device disclosed in Patent Literature 1 have been proposed as a measure for solving the problems occurring in the above respective structures. Specifically, the SiC semiconductor device is of a structure in which while the electric field relaxation layers are formed so as to intersect with the trench gate having one direction as a longitudinal direction, the electric field relaxation layers are configured as a two-layer structure having different impurity concentrations in a depth direction where a deep portion is a high concentration region and a shallow portion is a low concentration region. With the above structure, the SiC semiconductor device obtains both of the effect of relaxing the electric field in the bottom portion of the trench in the deep layer set as the high concentration region, and the effect of restraining the depletion layer from extending in the vicinity of the trench in the shallow layer set as the low concentration region to reduce a JFET resistance. In addition, the SiC semiconductor device makes it possible to be less likely to generate a manufacturing error caused by a deviation in the position of the electric field relaxation layer and the trench.

However, in the structure of Patent Literature 1, although the electric field relaxation effect, the JFET resistance reduction effect, and the effect of increasing a manufacturing error tolerance can be obtained, because a trench gate is formed on a damage in a crystal structure generated at the time of forming the electric field relaxation layers, the reliability of the trench gate is reduced. That is, after the electric field relaxation layers have been formed by ion implantation, the base region or the like is epitaxially grown on the electric field relaxation layers and then intersects with the electric field relaxation layers. For that reason, because crystal defects at the time of ion implantation are also taken over by a layer formed on the crystal defects, and the trench gate is formed so as to intersect with a portion where the crystal defects are inherited, variations may occur in the quality of the gate insulating film, or a leak path may be formed. For that reason, such a problem that the reliability of the trench gate is lowered occurs.

PATENT LITERATURE

Patent Literature 1: JP-A-2012-169386

SUMMARY

It is an object of the present disclosure to provide an SiC semiconductor device having a trench gate structure with a high breakdown voltage and a high reliability and a method of manufacturing the SiC semiconductor device.

According to a first aspect of the present disclosure, a silicon carbide semiconductor device includes: a substrate having a first conductivity type or a second conductivity type and made of silicon carbide; a drift layer disposed over the substrate, made of silicon carbide, and having the first conductivity type with an impurity concentration lower than the substrate; a base region disposed over the drift layer, made of silicon carbide, and having the second conductivity type; a plurality of source regions disposed over an upper layer portion of the base region, made of silicon carbide, and having the first conductivity type with an impurity concentration higher than the drift layer; a contact region disposed over the upper layer portion of the base region between opposing source regions, made of silicon carbide, and having the second conductivity type with an impurity concentration higher than the base layer; a plurality of trenches disposed from a surface of each source region to a depth deeper than the base region, and arranged in parallel to each other along one direction as a longitudinal direction; a gate insulating film arranged on an inner wall of each trench; a gate electrode arranged on the gate insulating film in each trench; a source electrode electrically connected to the source regions and the contact region; a drain electrode arranged over a rear surface of the substrate; and a plurality of electric field relaxation layers disposed in the drift layer located below the base region, spaced apart from a side of each trench, arranged between adjacent trenches along a direction as a longitudinal direction parallel to the longitudinal direction of the trenches, made of silicon carbide, and having the second conductivity type. Each of the plurality of electric field relaxation layers includes: a first region that is arranged at a position deeper than the trenches; and a second region that is arranged from a surface of the drift layer to the first region, has an impurity concentration lower than the first region, and has a uniform impurity concentration.

As described above, the SiC semiconductor device is of a structure having the electric field relaxation layers deeper than the trench in which the high concentration first region is formed at the deep position. For that reason, the depletion layer at the pn junction between the first region of the electric field relaxation layers and the drift layer largely extends toward the drift layer side, and a high voltage due to the influence of the drain voltage hardly enters the gate insulating film. Therefore, the electric field concentration in the gate insulating film, in particular, the electric field concentration at the bottom portion of the trench in the gate insulating film can be alleviated. This makes it possible to prevent the gate insulating film from being destroyed.

Further, the impurity concentration of the second region is set to be uniform in concentration. In the case where the impurity concentration in the second region varies in the depth direction, a variation occurs in the elongation of the depletion layer due to the shading of the impurity concentration, and a place where a current path between the electric field relaxation layers narrows occurs, to thereby cause an increase in the on-resistance. On the other hand, when the second region is set to be uniform in concentration, there is no variation in the elongation of the depletion layer, and there is no place where the current path between the electric field relaxation layers narrows. Therefore, the electric field relaxation effect can be obtained while suppressing an increase of the on-resistance.

According to a second aspect of the present disclosure, a method of manufacturing a silicon carbide semiconductor device includes: forming a drift layer, made of silicon carbide and having a first conductivity type with an impurity concentration lower than a substrate, over the substrate made of silicon carbide and having the first conductivity type or a second conductivity type; forming a plurality of electric field relaxation layers, having the second conductivity type in the drift layer and arranged in parallel to each other along one direction as a longitudinal direction, in the drift layer; forming a base region, made of silicon carbide and having the second conductivity type, over the electric field relaxation layers and the drift layer; forming a plurality of source regions, made of silicon carbide and having the first conductivity type with an impurity concentration higher than the drift layer, over an upper layer portion of the base region in the base region; forming a contact region, made of silicon carbide and having the second conductivity type with an impurity concentration higher than the base layer, over the upper layer portion of the base region between opposing source regions; forming a plurality of trenches disposed from a surface of each source region, penetrating the base region, reaching the drift layer, having a bottom shallower than a bottom of each electric field relaxation layer, spaced apart from the electric field relaxation layers, and arranged along a direction as a longitudinal direction parallel to the longitudinal direction of the electric field relaxation layers; forming a gate insulating film on a surface of each trench; forming a gate electrode on the gate insulating film in each trench; forming a source electrode electrically connected to the source regions and the contact region; and forming a drain electrode over a rear surface of the substrate. The forming of the electric field relaxation layers includes: forming a first region at a position deeper than the trenches; and forming a second region arranged from a surface of the drift layer to the first region, having an impurity concentration lower than the first region, and having a uniform impurity concentration.

The method of manufacturing the silicon carbide semiconductor device is of a structure having the electric field relaxation layers deeper than the trench in which the high concentration first region is formed at the deep position. For that reason, the depletion layer at the pn junction between the first region of the electric field relaxation layers and the drift layer largely extends toward the drift layer side, and a high voltage due to the influence of the drain voltage hardly enters the gate insulating film. Therefore, the electric field concentration in the gate insulating film, in particular, the electric field concentration at the bottom portion of the trench in the gate insulating film can be alleviated. This makes it possible to prevent the gate insulating film from being destroyed.

Further, the impurity concentration of the second region is set to be uniform in concentration. In the case where the impurity concentration in the second region varies in the depth direction, a variation occurs in the elongation of the depletion layer due to the shading of the impurity concentration, and a place where a current path between the electric field relaxation layers narrows occurs, to thereby cause an increase in the on-resistance. On the other hand, when the second region is set to be uniform in concentration, there is no variation in the elongation of the depletion layer, and there is no place where the current path between the electric field relaxation layers narrows. Therefore, the electric field relaxation effect can be obtained while suppressing an increase of the on-resistance.

According to a third aspect of the present disclosure, a silicon carbide semiconductor device includes: a substrate having a first conductivity type or a second conductivity type and made of silicon carbide; a drift layer disposed over the substrate, made of silicon carbide, and having the first conductivity type with an impurity concentration lower than the substrate; a base region disposed over the drift layer, made of silicon carbide, and having the second conductivity type; a plurality of source regions disposed over an upper layer portion of the base region, made of silicon carbide, and having the first conductivity type with an impurity concentration higher than the drift layer; a contact region disposed over the upper layer portion of the base region between opposing source regions, made of silicon carbide, and having the second conductivity type with an impurity concentration higher than the base layer; a plurality of trenches disposed from a surface of each source region to a depth deeper than the base region, and arranged in parallel to each other along one direction as a longitudinal direction; a gate insulating film arranged on an inner wall of each trench; a gate electrode arranged on the gate insulating film in each trench; a source electrode electrically connected to the source regions and the contact region; a drain electrode arranged over a rear surface of the substrate; and a plurality of electric field relaxation layers disposed in the drift layer located below the base region, spaced apart from a side of each trench, arranged between adjacent trenches along a direction as a longitudinal direction parallel to the longitudinal direction of the trenches, made of silicon carbide, and having the second conductivity type. Each of the plurality of electric field relaxation layers includes: a first region that is arranged at a position deeper than the trenches; and a second region that is arranged from a surface of the drift layer to the first region and has a uniform impurity concentration. A distance between adjacent second regions is defined as W1. A distance between adjacent first regions is defined as W2. A relationship of "W1>W2" is satisfied. A width of a trench gate structure, in which the gate insulating film and the gate electrode are disposed in each of the trenches, is defined as W3. A relationship of "W2>W3" is satisfied.

As described above, the SiC semiconductor device is of a structure having the electric field relaxation layers deeper than the trench in which the high concentration first region is formed at the deep position. For that reason, the depletion layer at the pn junction between the first region of the electric field relaxation layers and the drift layer largely extends toward the drift layer side, and a high voltage due to the influence of the drain voltage hardly enters the gate insulating film. Therefore, the electric field concentration in the gate insulating film, in particular, the electric field concentration at the bottom portion of the trench in the gate insulating film can be alleviated. This makes it possible to prevent the gate insulating film from being destroyed.

Further, the impurity concentration of the second region is set to be uniform in concentration. In the case where the impurity concentration in the second region varies in the depth direction, a variation occurs in the elongation of the depletion layer due to the shading of the impurity concentration, and a place where a current path between the electric field relaxation layers narrows occurs, to thereby cause an increase in the on-resistance. On the other hand, when the second region is set to be uniform in concentration, there is no variation in the elongation of the depletion layer, and there is no place where the current path between the electric field relaxation layers narrows. Therefore, the electric field relaxation effect can be obtained while suppressing an increase of the on-resistance.

BRIEF DESCRIPTION OF DRAWINGS

The above and other objects, features and advantages of the present disclosure will become more apparent from the following detailed description made with reference to the accompanying drawings. In the drawings:

FIG. 16A is a cross-sectional view of an SiC semiconductor device in the conventional art, and FIG. 16B is an enlarged view of a portion XVIB in FIG. 16A.

DETAILED DESCRIPTION

First Embodiment

Figure 1:
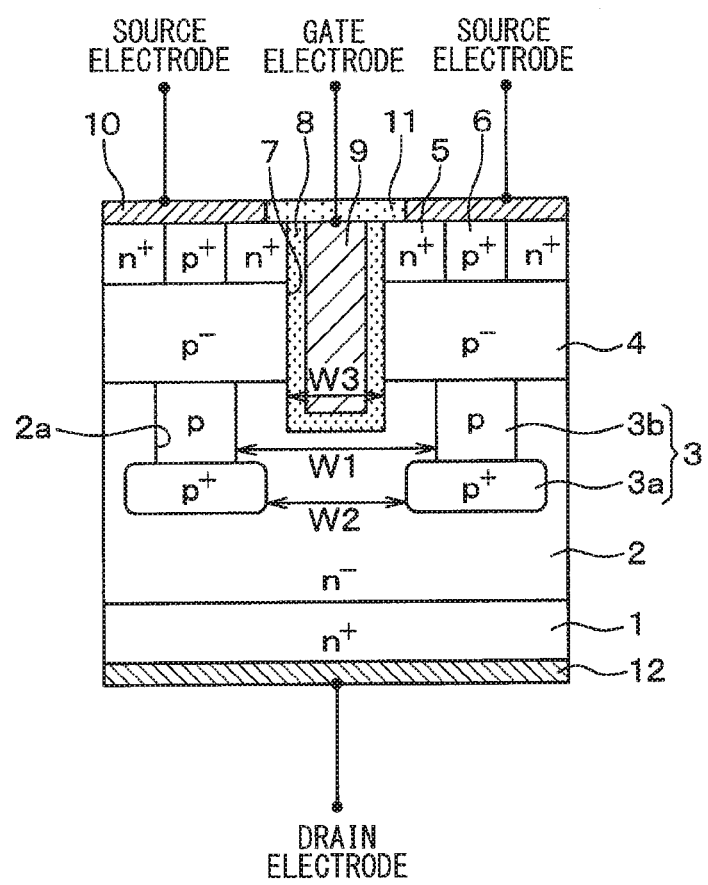
FIG. 1 is a diagram illustrating a cross-sectional configuration of an SiC semiconductor device according to a first embodiment of the present disclosure.

A first embodiment of the present disclosure will be described. First, an SiC semiconductor device having a vertical MOSFET with an inverted trench gate structure according to the present embodiment will be described with reference to FIG. 1. FIG. 1 illustrates only one cell of the vertical MOSFET. However, multiple cells each having the same structure as that of the vertical MOSFET illustrated in FIG. 1 are arranged adjacent to each other.

As illustrated in FIG. 1, an n+ type semiconductor substrate 1 having a thickness of about 300 μm and made of SiC single crystal doped with n-type impurities (such as phosphorus or nitrogen) at a high concentration, for example, an impurity concentration of $1 \times 10^{19}$ to $1 \times 10^{20}$ cm$^{-3}$ is used. An n-type drift layer 2 having a thickness of about 10 to 15 μm and made of SiC doped with the n-type impurities at an impurity concentration of, for example, $1 \times 10^{15}$ to $1 \times 10^{16}$ cm$^{-3}$ is formed over the n+ type semiconductor substrate 1.

Concave portions (first concave portions) 2a are partially recessed in the n-type drift layer 2. The concave portions 2a are each formed in a linear shape having one direction (a direction perpendicular to a paper surface) as a longitudinal direction, and extends to a position deeper than a trench 7 configuring a trench gate structure to be described later with the same direction as that of the trench 7 as the longitudinal direction.

Electric field relaxation layers 3 doped with p-type impurities (boron, aluminum or the like) whose longitudinal direction is the same direction as the longitudinal direction of the concave portions 2a are formed below bottom portions of the concave portions 2a and within the concave portions 2a. A portion of each electric field relaxation layer 3 located below the bottom portion of the concave portion 2a, that is, a portion deeper than the trench 7 is set as a high concentration region (first region) 3a in which a p-type impurity concentration is set to a high concentration. In addition, a portion of each electric field relaxation layer 3 located inside the concave portion 2a is set to be a low concentration region (second region) 3b in which the p-type impurity concentration is lower than that of the high concentration region 3a. The high concentration region 3a and the low concentration region 3b having different impurity concentrations configure each electric field relaxation layer 3.

The high concentration regions 3a have a concentration of, for example, about $1\times10^{17}$ to $1\times10^{19}$ $cm^{-3}$. On the other hand, the low concentration regions 3b have a concentration of about $1\times10^{15}$ to $1\times10^{18}$ $cm^{-3}$, and the concentration of the low concentration regions 3b is set to be lower than that of the high concentration regions 3a. The low concentration regions 3b are formed with a uniform impurity concentration in the entire region.

In addition, in a width of the electric field relaxation layers 3, that is, a dimension of the electric field relaxation layers 3 in a direction perpendicular to the longitudinal direction of the electric field relaxation layers 3 in a planar direction parallel to a substrate plane, the high concentration regions 3a are wider than the low concentration regions 3b. Specifically, the electric field relaxation layers 3 are disposed on both sides of the trench 7 configuring the trench gate structure, which will be described later, such that the respective low concentration regions 3b are separated from side surfaces of the trench 7 by a predetermined distance. Then, when it is assuming that a distance between the adjacent low concentration regions 3b located on both sides of the trench gate structure is W1, a distance between the high concentration regions 3a is W2, and a width of the trench gate structure is W3, at least a relationship of W1>W2 and W3 is satisfied, and preferably a relationship W2>W3 is also satisfied. With the setting of W2>W3, the JFET region can be prevented from spreading between the adjacent electric field relaxation layers 3, a shortest current path between the trench gate structure and a drain electrode 12 to be described later can be ensured, and an increase in an on-resistance can be suppressed.

Further, in the case of a depth of the electric field relaxation layers 3, the low concentration regions 3b are formed to a position deeper than a bottom portion of the trench 7 in the trench gate structure so that an entire region of the high concentration regions 3a is formed at a position deeper than the bottom portion of the trench 7.

Further, a p-type base region 4 is formed over surfaces of the n-type drift layer 2 and the electric field relaxation layers 3. The p-type base region 4 is a layer configuring a channel of the vertical MOSFET, and is formed so as to come in contact with the side surfaces of the trench 7 on both sides of the trench 7 configuring the trench gate structure to be described later.

On a trench gate structure side of a surface layer portion of the p-type base region 4 with respect to positions corresponding to the electric field relaxation layers 3, $n^+$ type source regions 5 doped with n-type impurities at a high concentration is formed so as to come in contact with the trench gate structure. In the present embodiment, for example, the $n^+$ type source regions 5 are formed with an impurity concentration of about $1\times10^{21}$ $cm^{-3}$ and a thickness of about 0.3 μm. $P^+$ type contact regions 6 doped with p-type impurities at a high concentration are formed at positions of the surface layer portion of the p-type base region 4 corresponding to the electric field relaxation layers 3, in other words, between the facing $n^+$ type source regions 5. In the present embodiment, for example, the $p^+$ type contact regions 6 are formed with an impurity concentration of about $1\times10^{21}$ $cm^{-3}$ and a thickness of about 0.3 μm.

Further, in the cross section of FIG. 1, the trench 7 is provided at a center position of the electric field relaxation layers 3 disposed adjacent to each other. The trench 7 penetrates through the p-type base region 4 and the $n^+$ type source regions 5, reaches the n-type drift layer 2 and is set to be shallower than the bottom portion of the electric field relaxation layers 3. The p-type base region 4 and the $n^+$ type source regions 5 are arranged so as to come in contact with the side surfaces of the trench 7. An inner wall surface of the trench 7 is covered with a gate insulating film 8 formed of an oxide film or the like, and an inside of the trench 7 is filled with a gate electrode 9 made of doped Poly-Si formed on the surface of the gate insulating film 8. In the above manner, the trench gate structure is configured by a structure including the gate insulating film 8 and the gate electrode 9 in the trench 7.

Although not shown in FIG. 1, the trench gate structure is formed into, for example, a strip shape with a direction perpendicular to a paper surface as a longitudinal direction, and multiple trench gate structures are arranged in stripes at equal intervals in a horizontal direction of the paper surface to provide multiple cells.

Further, source electrodes 10 are formed on the surfaces of the $n^+$ type source regions 5 and the $p^+$ type contact regions 6. The source electrodes 10 are made of multiple metals (for example, Ni/Al or the like). Specifically, portions of the source electrodes 10 connected to the $n^+$ type source regions 5 are made of a metal capable of coming in ohmic contact with n-type SiC, and portions of the source electrodes 10 connected to the p-type base regions 4 through the $p^+$ type contact regions 6 are made of a metal capable of coming in ohmic contact with p-type SiC. Note that the source electrodes 10 are electrically separated from a gate wire not shown electrically connected to the gate electrode 9 through an interlayer insulating film 11. The source electrodes 10 are brought into electric contact with the $n^+$ type source regions 5 and the $p^+$ type contact regions 6 through a contact hole provided in the interlayer insulating film 11.

Further, a drain electrode 12 electrically connected to the $n^+$ type semiconductor substrate 1 is formed on a rear side of the $n^+$ type semiconductor substrate 1. With the above structure, the vertical MOSFET having the inverted trench gate structure of the n-channel type is configured.

In the vertical MOSFET configured as described above, when a gate voltage is applied to the gate electrode 9, portions of the p-type base region 4 which come in contact with the side surfaces of the trench 7 become inverted channels and allow a current to flow between the source electrode 10 and the drain electrode 12.

On the other hand, when no gate voltage is applied, a high voltage (for example, 1200 V) is applied as a drain voltage. In SiC having an electric field breakdown strength nearly ten times that of a silicon device, an electric field nearly 10 times as high as that of the silicon device is applied also to the gate insulating film 8 due to an influence of a voltage of SiC, and an electric field concentration may occur in the gate insulating film 8 (in particular, on the bottom portion of the trench 7 in the gate insulating film 8).

However, in the present embodiment, the SiC semiconductor device is of a structure having the electric field relaxation layers 3 deeper than the trench 7 in which the high concentration regions 3a are formed at the deep position. For that reason, the depletion layers at the pn junction between the high concentration regions 3a of the electric field relaxation layers 3 and the n-type drift layer 2 largely extend toward the n-type drift layer 2 side, and a high voltage due to the influence of the drain voltage hardly enters the gate insulating film 8. In particular, since the distance W2 between the high concentration regions 3 a is set to be narrower with the high concentration regions 3a wider than the low concentration region 3b, a high voltage caused by an influence of the drain voltage hardly more enters the gate insulating film 8.

Therefore, the electric field concentration in the gate insulating film 8, in particular, the electric field concentration at the bottom portion of the trench 7 in the gate insulating film 8 can be alleviated. As a result, the SiC semiconductor device with high withstand voltage capable of preventing the gate insulating film 8 from being destroyed is obtained.

Further, the high concentration regions 3a are configured at positions deeper than the trench gate structure in the electric field relaxation layers 3 and portions shallower than the high concentration regions 3a are set to be the low concentration regions 3b. As a result, the low concentration regions 3b are arranged in a portion where the channel is formed on the side surfaces of the trench 7. For that reason, as compared with the case where the overall electric field relaxation layers 3 are configured with a high concentration, the extension of a depletion layer spreading from the low concentration region 3b to the trench 7 side, that is, in the n-type drift layer 2 at the channel side can be suppressed, and the effect of suppressing the JFET resistance can be obtained.

Furthermore, in the case of the present embodiment, the electric field relaxation layers 3 and the trench gate structure are arranged in parallel to each other, and do not intersect with each other. For that reason, as will be described later, even if the high concentration regions 3a in the electric field relaxation layers 3 are formed by ion implantation, the trench gate structure can be isolated from portions of the high concentration regions 3a and respective parts formed on the high concentration regions 3a by epitaxial growth where damage caused by ion implantation may remain. Furthermore, since the regions to be ion-implanted are only the high concentration regions 3a, the damage caused by the ion implantation in the crystal can be minimized.

Therefore, the occurrence of a variation in the quality of the gate insulating film 8 can be suppressed, and the formation of a leak path can be suppressed, as a result of which a reduction in reliability of the trench gate can be suppressed. As a result, the SiC semiconductor device having the trench gate structure high in a breakdown voltage and reliability can be obtained.

Subsequently, a method of manufacturing the vertical MOSFET with the trench gate type illustrated in FIG. 1 will be described with reference to FIGS. 2A to 3D.

Figure 2A:
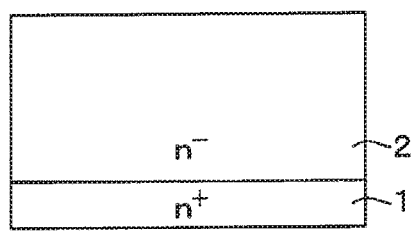
FIGS. 2A to 2E are cross-sectional views illustrating a process of manufacturing the SiC semiconductor device illustrated in FIG. 1, FIG. 3A to 3D are cross-sectional views illustrating a process of manufacturing the SiC semiconductor device subsequently to FIG. 2E.

(Process Illustrated in FIG. 2A)

First, an epitaxial substrate in which the n-type drift layer 2 is epitaxially grown on the surface of the $n^+$ type semiconductor substrate 1 made of SiC single crystal doped with n-type impurities at a high concentration is prepared.

Figure 2D:
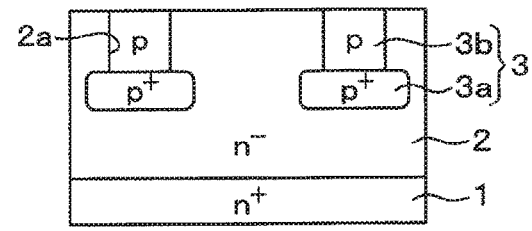
Figure 2B:
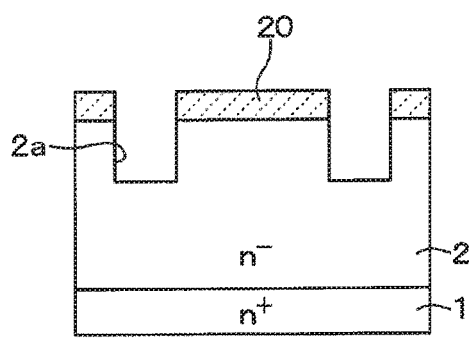

(Process Illustrated in FIG. 2B)

A mask material such as an oxide film is deposited on the n-type drift layer 2, and then patterned to form a mask 20 in which regions where the concave portions 2a are to be formed, that is, regions where the p-type deep layers 3b are to be formed are opened. Then, with the use of the mask 20, anisotropic etching such as RIE (Reactive Ion Etching) is performed. As a result, the surface layer portion of the n-type drift layer 2 is removed at the openings of the mask 20 to form the concave portions 2a. A depth and a width of the concave portions 2a are set so that the depth and the width of the low concentration regions 3b finally produced become target values in consideration of a thermal diffusion by each process performed subsequently. In the case of SiC, since the diffusion amount caused by the thermal diffusion is very small, the dimensions of the concave portions 2a may be determined with the same dimensions as the depth and width of the low concentration regions 3b finally produced without considering the thermal diffusion.

Figure 2E:
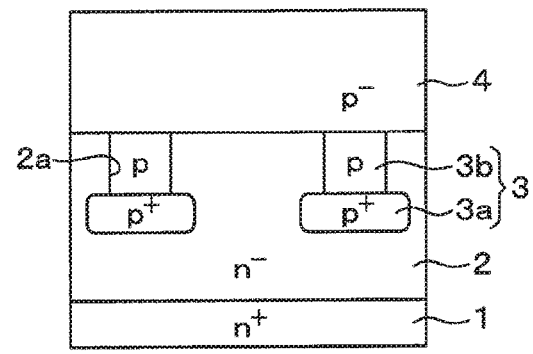
Figure 2C:
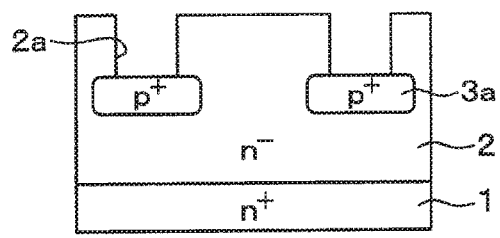

(Process Illustrated in FIG. 2C)

After the removal of the mask 20 used for forming the concave portions 2a, p-type impurities are ion-implanted into the bottom portion of the concave portions 2a with the use of an ion implantation mask not shown. Then, with the activation of the impurities implanted by heat treatment or the like, the high concentration regions 3a are formed. The lateral extension of the high concentration regions 3a at that time are caused by the thermal diffusion, but basically, the p-type impurities are implanted in a laterally spread state by oblique ion implantation whereby the high concentration region 3a are configured with a desired width.

(Process Illustrated in FIG. 2D)

After the removal of the mask for ion implantation, the low concentration regions 3b are epitaxially grown in the concave portions 2a. For example, the p-type impurity layer 3 can be formed by performing epitaxial growth while introducing a gas containing a dopant into an atmosphere with the use of a CVD (Chemical Vapor Deposition) apparatus. At that time, although the p-type base region 4 can be simultaneously formed on the surface of the p-type drift layer 2, only the low concentration regions 3b are formed in this situation and unnecessary portions to be formed on the p-type drift layer 2 are removed by CMP (Chemical Mechanical Polishing) or the like. In addition, since the low concentration regions 3b are epitaxially grown in the concave portions 2a through a technique such as CVD, the entire low concentration regions 3b can be formed with a uniform impurity concentration.

(Process Illustrated in FIG. 2E)

The p-type base region 4 is epitaxially grown by the same method as that of the low concentration regions 3b. At that time, as described above, the p-type base region 4 can be formed at the same time as the low concentration regions 3b, and the manufacturing process can be simplified. However, if those regions are formed in separate processes, impurity concentrations of the respective regions can be set, separately.

Figure 3A:
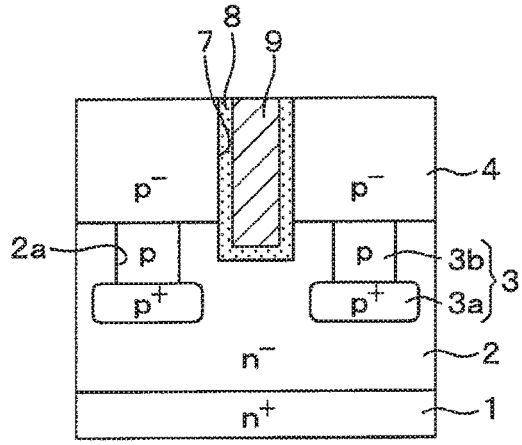

(Process Illustrated in FIG. 3A)

An etching mask not shown in which a region where the trench 7 is to be formed is opened while covering the surface of the p-type base region 4 is disposed. Then, after anisotropic etching using the etching mask has been performed, isotropic etching and sacrificial oxidation processes are performed as needed to form the trench 7. As a result, the trench 7 that penetrates through the p-type base region 4, reaches the n-type drift layer 2, is shallower than the electric field relaxation layers 3, and is disposed between the adjacent low concentration regions 3b so as to be spaced apart from the low concentration regions 3b can be formed.

Next, after the removal of the etching mask, a gate oxidation process is performed to form the gate insulating film 8. Further, after a polysilicon layer doped with impurities has been formed on the surface of the gate insulating film 8, the polysilicon layer is patterned to form the gate electrode 9. As a result, the trench gate structure is formed.

Figure 3B:
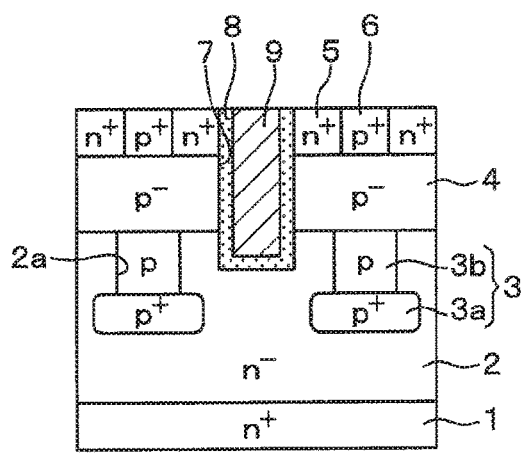

(Process Illustrated in FIG. 3B)

After a mask (not illustrated) in which regions where the n$^+$ type source regions 5 are to be formed are opened has been formed on the surface of the p-type base region 4, n-type impurities are ion-implanted at a high concentration from above the mask to form the n$^+$ type source regions 5. Similarly, after a mask (not illustrated) in which regions where the p$^+$ type contact regions 6 are to be formed are opened has been formed on the surface of the p-type base region 4, p-type impurities are ion-implanted from above the mask at a high concentration, to thereby form the p$^+$ type contact regions 6.

Figure 3C:
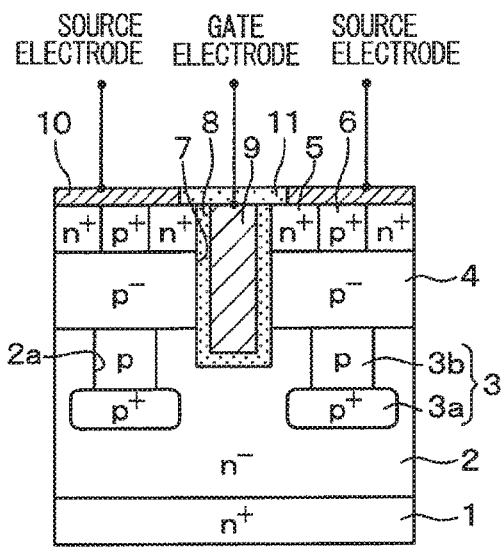

(Process Illustrated in FIG. 3C)

After the interlayer insulating film 11 has been formed, the interlayer insulating film 11 is patterned to provide contact holes exposing the n$^+$ type source regions 5 and the p-type base region 4, and also to provide a contact hole exposing the gate electrode 9 in a cross section different from the cross section shown. Then, after an electrode material has been deposited so as to fill the contact hole, the electrode material is patterned to form the source electrode 10 and a gate wire not shown.

Figure 3D:
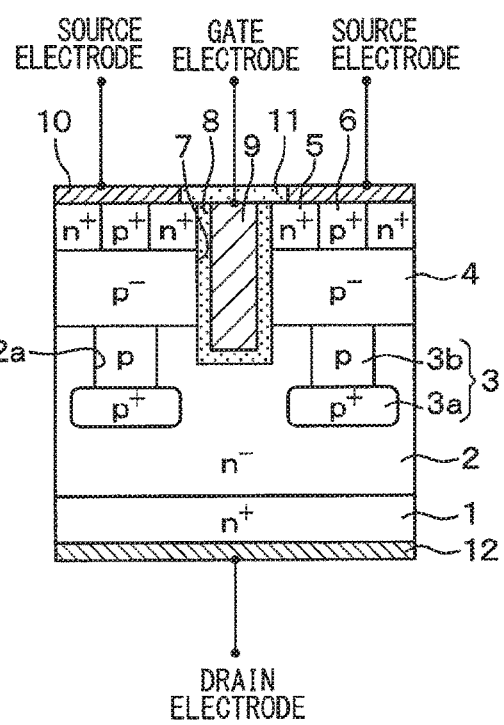

(Process Illustrated in FIG. 3D)

The drain electrode 12 is formed on a rear surface side of the n$^+$ type semiconductor substrate 1. With the above process, the vertical MOSFET illustrated in FIG. 1 is completed.

As described above, in the present embodiment, the SiC semiconductor device is of a structure having the electric field relaxation layers 3 deeper than the trench 7 in which the high concentration regions 3a are provided at the deep position, and the regions shallower than the high concentration regions 3a are provided as the low concentration regions 3b. For that reason, the electric field relaxation effect and the JFET resistance reduction effect can be obtained.

In addition, the electric field relaxation layers 3 and the trench gate structure are arranged in parallel to each other, and do not intersect with each other. For that reason, the trench gate structure is isolated from portions of the high concentration regions 3a and respective parts formed on the high concentration regions 3a by epitaxial growth where damage caused by ion implantation may remain. Furthermore, since the regions to be ion-implanted are only the high concentration regions 3a, the damage caused by the ion implantation in the crystal can be minimized. Therefore, the occurrence of a variation in the quality of the gate insulating film 8 can be suppressed, and the formation of a leak path can be suppressed, and a reduction in reliability of the trench gate can be suppressed. As a result, the SiC semiconductor device having the trench gate structure higher in the reliability can be obtained.

Further, as in the present embodiment, the impurity concentration of the low concentration region 3b is set to be uniform over the entire region. In the case where the impurity concentration in the low impurity region 3b varies in the depth direction, a variation occurs in the elongation of the depletion layer due to the shading of the impurity concentration, and a place where a current path between the electric field relaxation layers 3 narrows occurs, to thereby cause an increase in the on-resistance. On the other hand, as in the present embodiment, when the impurity concentration of the low concentration regions 3b is set to be uniform, there is no variation in the elongation of the depletion layer, and there is no place where the current path between the electric field relaxation layers 3 narrows. Therefore, the electric field relaxation effect can be obtained while suppressing an increase of the on-resistance. In particular, when the electric field relaxation layers 3 are used with a depth of 1 μm or more, a variation in the elongation of the depletion layer due to the shading of the impurity concentration is liable to occur and an influence of the variation is likely to occur. Therefore, with the provision of the configuration as in the present embodiment, the effect of suppressing an increase in the on-resistance can be obtained.

FIGS. 16A and 16B illustrate a cross-sectional view and a partially enlarged view of the SiC semiconductor device in the conventional art (Japanese Patent No. 5539931), respectively. In the case where the impurity concentration in the second region varies in the depth direction, a variation occurs in the elongation of the depletion layer due to the shading of the impurity concentration, and a place where a current path between the electric field relaxation layers narrows occurs, to thereby cause an increase in the on-resistance.

Figures 17A, 17B:
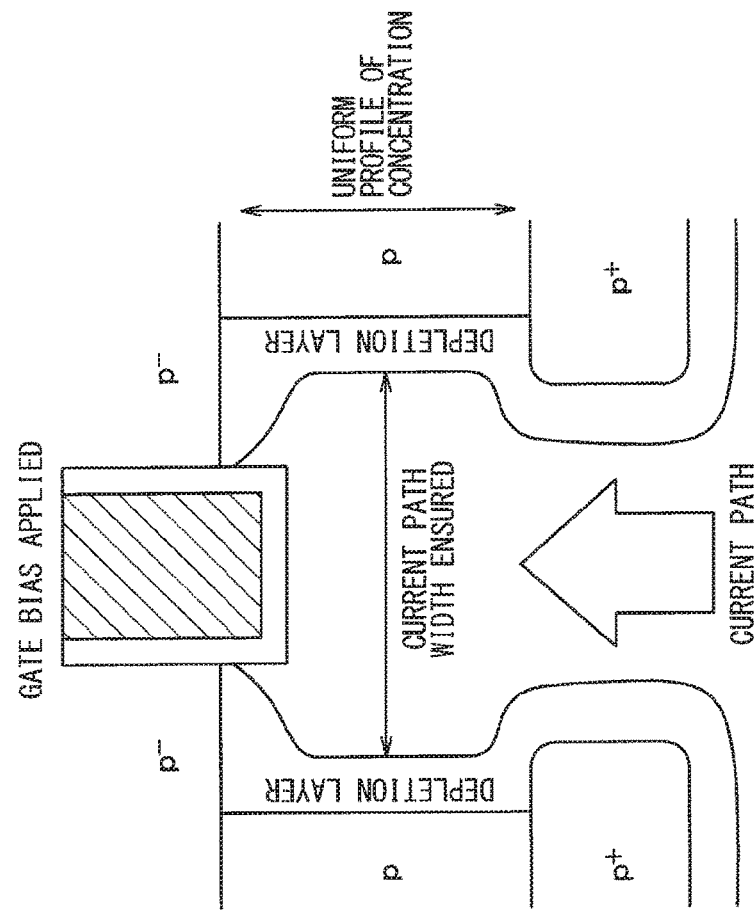
FIG. 17A is a cross-sectional view of the SiC semiconductor device according to the first embodiment of the present disclosure.
FIG. 17B is an enlarged view of a portion XVIIB in FIG. 17A.

On the contrary, in the SiC semiconductor device according to the present embodiment, the impurity concentration of the low concentration regions 3b, that is, the second regions are set to be uniform in concentration. FIGS. 17A and 17B illustrate a cross-sectional view and a partially enlarged view of the SiC semiconductor device according to the present embodiment, respectively. When the second regions are set to be uniform in concentration, there is no variation in the elongation of the depletion layer, and there is no place where the current path between the electric field relaxation layers narrows. Therefore, the electric field relaxation effect can be obtained while suppressing an increase of the on-resistance.

Figure 18:
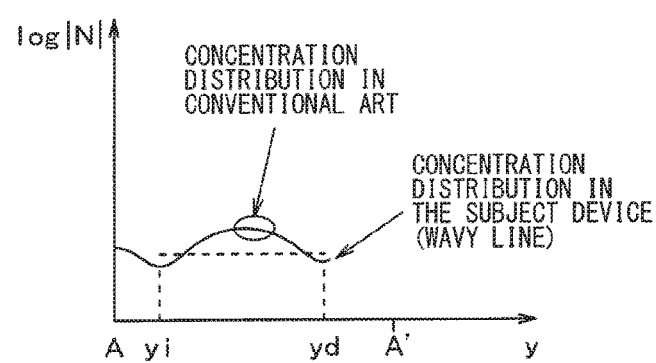
FIG. 18 is a graph showing concentration distributions of an upper portion of an electric field relaxation layer of the SiC semiconductor device according to the conventional art and the first embodiment of the present disclosure.

FIG. 18 illustrates a depth distribution of the impurity concentration in upper portions of the electric field relaxation layers, that is, in the second regions of the SiC semiconductor device in the conventional art and the present embodiment. The impurity concentration varies between yi and yd in the conventional art whereas the impurity concentration is higher than the lowest impurity concentration of the conventional art and lower than the highest impurity concentration of the conventional art, and kept constant in the SiC semiconductor device according to the present embodiment.

Furthermore, in the present embodiment, the high impurity regions 3a are formed by ion implantation of the p-type impurities into the bottom surfaces of the concave portions 2a and the low impurity regions 3b are formed by epitaxial growth in the concave portions 2a. According to the manufacturing method described above, the formation positions of the high impurity regions 3a and the low impurity regions 3b can be set with self-alignment with respect to the formation positions of the concave portions 2a. Therefore, a formation positional deviation with respect to the trench gate structure can be suppressed.

Figure 4:
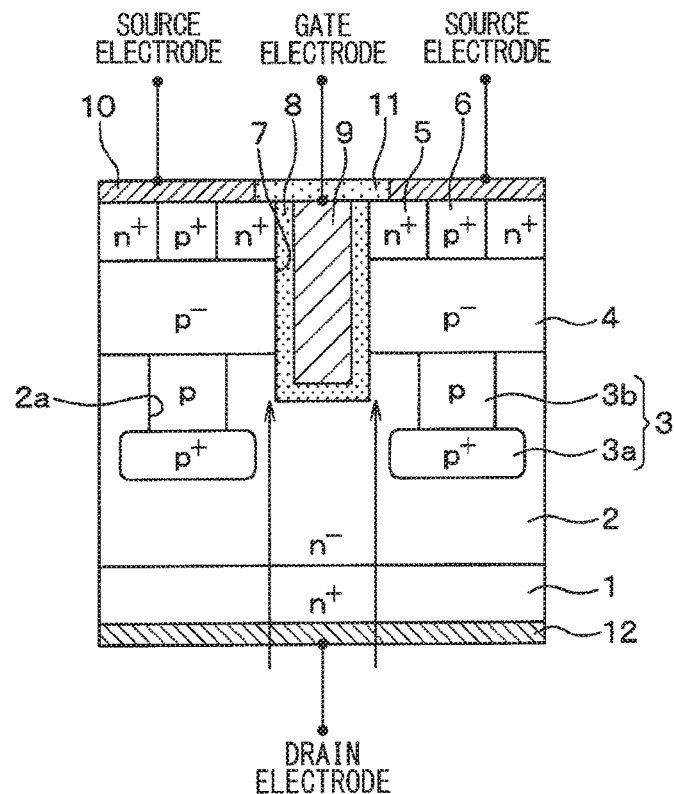
FIG. 4 is a cross-sectional view of the SiC semiconductor device in the case where there is no positional deviation between a high impurity region and a low impurity concentration region.
Figure 5:
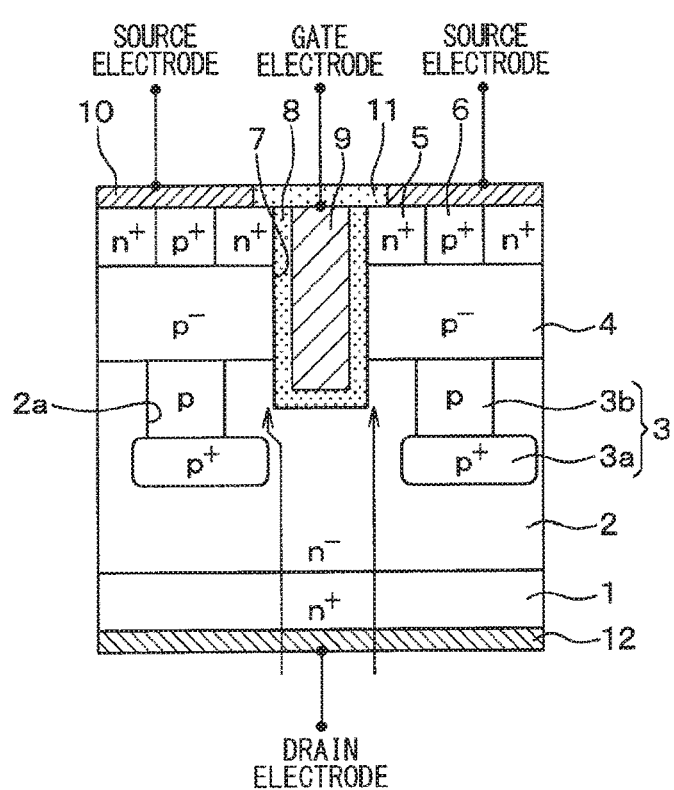
FIG. 5 is a cross-sectional view of the SiC semiconductor device in the case where there is a positional deviation between a high impurity region and a low impurity concentration region.

For example, in the case where the high impurity regions 3a and the low impurity regions 3b are formed by ion implantation, a formation positional deviation of the high impurity regions 3a and the low impurity regions 3b may occur depending on the presence or absence of the mask deviation, as illustrated in FIGS. 4 and 5. When a deviation in the formation position occurs as illustrated in FIG. 5, as compared with the case where a formation positional deviation does not occur as illustrated in FIG. 4, a current path indicated by arrows in the figure becomes longer with the deviation in the formation position of the high impurity regions 3a relative to the trench gate structure.

Therefore, according to the manufacturing method of the present embodiment, as illustrated in FIG. 4, a structure in which the formation positional deviation does not occur can be obtained, and the current path can be set to be shortest. This makes it possible to further suppress an increase in the on-resistance.

Second Embodiment

A second embodiment of the present disclosure will be described. In the present embodiment, the configuration of high concentration regions 3a is changed as compared with the first embodiment, and other configurations are identical with those in the first embodiment. Therefore, only parts different from those in the first embodiment will be described.

Figure 6:
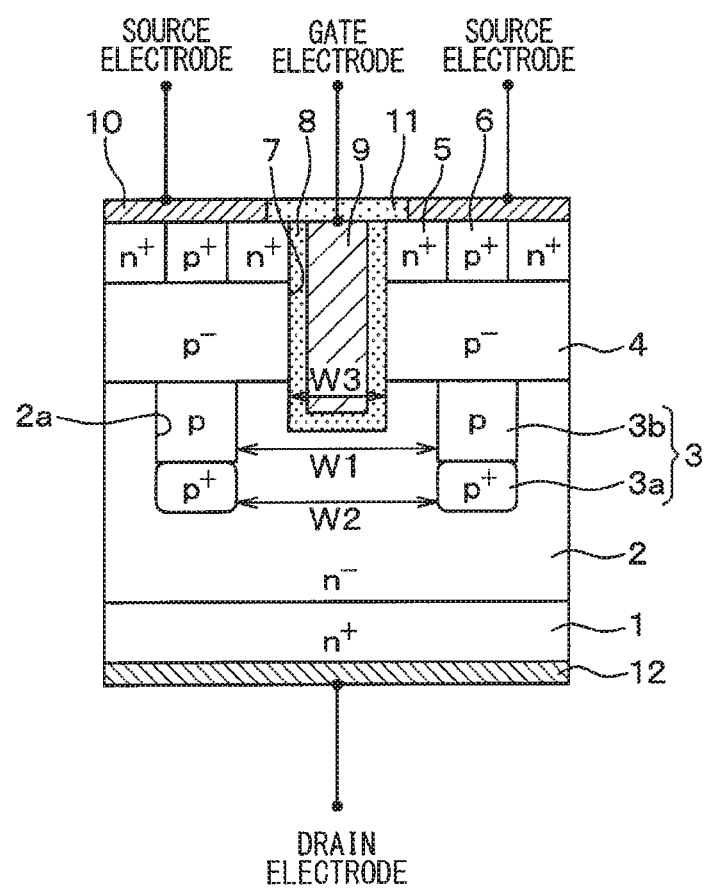
FIG. 6 is a diagram illustrating a cross-sectional configuration of an SiC semiconductor device according to a second embodiment of the present disclosure.

As illustrated in FIG. 6, in the present embodiment, a width of the high concentration regions 3a is set to be equal to or less than a width of low concentration regions 3b. A distance W2 between the high concentration regions 3a is set so as to satisfy W1≤W2 with respect to a distance W1 between the low concentration regions 3b located on both sides of the trench gate structure.

If the impurity concentration of the high concentration regions 3a is high, a high voltage caused by an influence of a drain voltage hardly enters a gate insulating film 8. Therefore, the width of the high concentration regions 3a may be set to be equal to or less than the width of the low concentration regions 3 depending on the impurity concentration of the high impurity regions 3a. Even with the above configuration, the same advantages as those in the first embodiment can be obtained.

In the SiC semiconductor device having the above structure, in a process of FIG. 2C described above, the p-type impurities may be directed not in the oblique ion implantation but in a direction perpendicular to the substrate. In the case where the width of the high concentration regions 3a is set to be smaller than the width of the low concentration regions 3b, an ion implantation mask whose width of an opening is smaller than a width of concave portions 2a may be used.

Third Embodiment

A third embodiment of the present disclosure will be described. The present embodiment is different from the first and second embodiments in a method of forming electric field relaxation layers 3, and the others are the same as those of the first and second embodiments. Therefore, only parts different from those in the first and second embodiments will be described. Incidentally, a case in which a method of forming the electric field relaxation layers 3 is changed in comparison with the first embodiment will be described. However, the electric field relaxation layers 3 can also be formed in the same manner for the second embodiment.

Figure 7A:
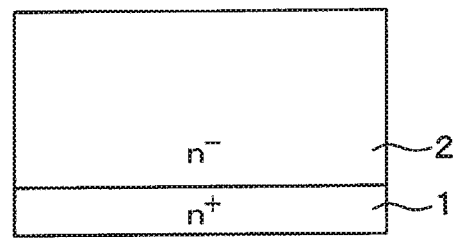
FIGS. 7A to 7C are cross-sectional views illustrating a process of manufacturing an SiC semiconductor device according to a third embodiment of the present disclosure.
Figure 7B:
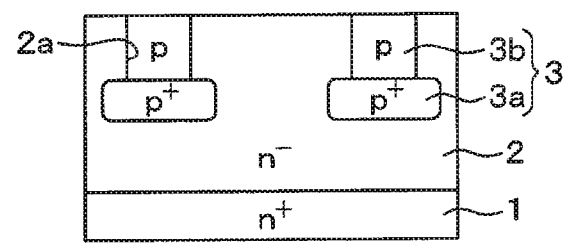

First, in a process illustrated in FIG. 7A, as in the process illustrated in FIG. 2A, an epitaxial substrate in which an n-type drift layer 2 is formed over a surface of an n$^+$ type semiconductor substrate 1 is prepared. Then, in a process illustrated in FIG. 7B, after an ion implantation mask not shown has been placed over a surface of the n-type drift layer 2, high concentration regions 3a and low concentration regions 3b are formed by ion implantation of p-type impurities. More particularly, after a first mask having openings of a width corresponding to the high concentration regions 3a has been disposed, p-type impurities are ion-implanted with the use of the first mask as an ion implantation mask. Subsequently, after a removal of the first mask, a second mask having openings of a width corresponding to the low concentration regions 3b is disposed, and then p-type impurities are ion-implanted with the use of the second mask as an ion implantation mask. Ion implantation for forming the low concentration regions 3b is performed by a box profile. As a result, the low concentration regions 3b are formed with a uniform impurity concentration. Then, with the execution of a heat treatment, implanted p-type ions are activated to form the high concentration regions 3a and the low concentration regions 3b. In this situation, an acceleration voltage for ion implantation is changed so that the acceleration voltage at the time of the ion implantation for forming the high concentration regions 3a is set to be higher than that at the time of the ion implantation for forming the low concentration regions 3b. As a result, the high impurity regions 3a are formed at deeper positions. Further, a dose amount of the p-type impurities at the time of ion implantation is changed so that the high concentration regions 3a are formed with a higher impurity concentration than the low concentration regions 3b.

Figure 7C:
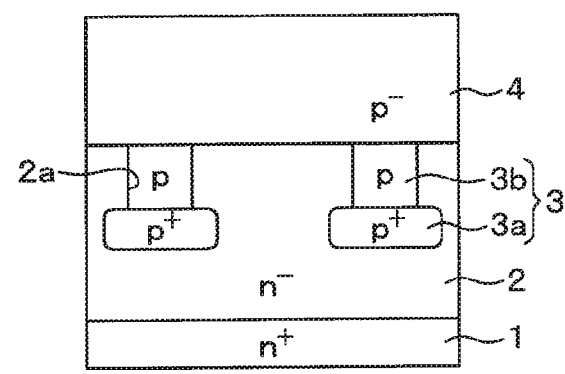

Thereafter, in a process illustrated in FIG. 7C, after a p-type base region 4 has been formed as in the process illustrated in FIG. 2C, the same processes as those illustrated in FIGS. 2D, 2E, and 3A to 3D are performed. With the above processes, the SiC semiconductor device having the trench gate type vertical MOSFET according to the present embodiment is completed.

As described above, not only the high concentration regions 3a but also the low concentration regions 3b of the electric field relaxation layers 3 can be formed by ion implantation. Even in the above way, the same advantages as those of the first and second embodiments can be obtained.

Fourth Embodiment

A fourth embodiment of the present disclosure will be described. The present embodiment is different from the first to third embodiments in the configuration of an n-type drift layer 2, and the others are the same as those of the first to third embodiments. Therefore, only parts different from those of the first to third embodiments will be described. Incidentally, a case in which the configuration of the n-type drift layer 2 is different from that in the first embodiment will be described, but the same configuration can be applied to the second and third embodiments.

Figure 8:
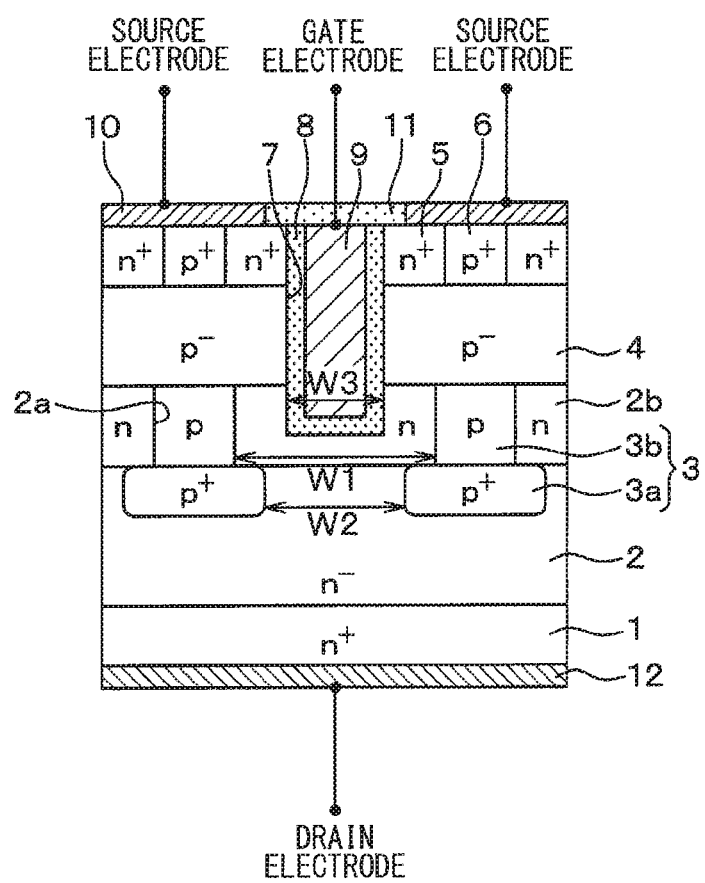
FIG. 8 is a diagram illustrating a cross-sectional configuration of an SiC semiconductor device according to a fourth embodiment of the present disclosure.

As illustrated in FIG. 8, in the present embodiment, portions of the n-type drift layers 2 located above the high concentration regions 3a are provided as high concentration layers 2b that are higher in the impurity concentration than the other portion of the n-type drift layers 2. For example, the high concentration layers 2b are set to be higher in the n-type impurity concentration than the other portions of the n-type drift layer 2 by about $2.0 \times 10^{15}$ cm$^{-3}$.

With the formation of the high concentration layers 2b as described above, a width of a depletion layer extending into the n-type drift layer 2 can be reduced in the vicinity of the trench 7. Therefore, in addition to a reduction in an internal resistance caused by an increase in an impurity concentration of the high concentration layers 2b, the width of the depletion layer in the n-type drift layer 2 can be reduced, thereby making it possible to further reduce a JFET resistance.

Next, a method of manufacturing a vertical MOSFET of a trench gate type illustrated in FIG. 8 will be described with reference to FIGS. 9A to 10E.

Figure 9A:
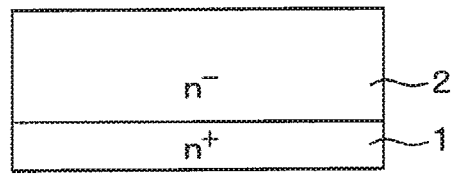
FIGS. 9A to 9E are cross-sectional views illustrating a process of manufacturing the SiC semiconductor device illustrated in FIG. 6, FIG. 10A to 10E are cross-sectional views illustrating a process of manufacturing the SiC semiconductor device subsequently to FIG. 9E.

First, in a process illustrated in FIG. 9A, as in the process illustrated in FIG. 2A, an epitaxial substrate in which a part of the n-type drift layer 2 is formed on a surface of the n$^+$ type semiconductor substrate 1 is prepared. Then, in a process illustrated in FIG. 9B, after an ion implantation mask not shown has been placed on a partial surface of the n-type drift layer 2, high concentration regions 3a are formed by ion implantation of p-type impurities. In this situation, the high concentration regions 3a are formed from the partial surface of the n-type drift layer 2.

Figure 9B:
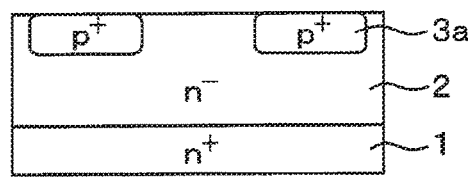

In this example, in the process of FIG. 9B, the high concentration regions 3a are formed by ion implantation. On the other hand, a manufacturing method may be applied in which concave portions are formed in regions where the high-concentration regions 3a are to be formed by etching in advance, and after p-type impurity layers have been embedded in the respective concave portions by epitaxial growth, the p-type impurity layers are flattened by polishing, to thereby form the high concentration regions 3a.

Figure 9C:
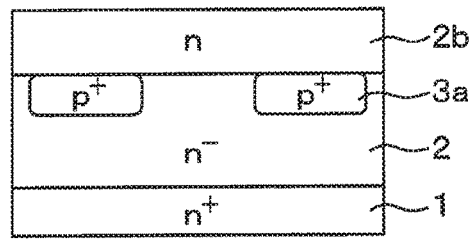
Figure 9D:
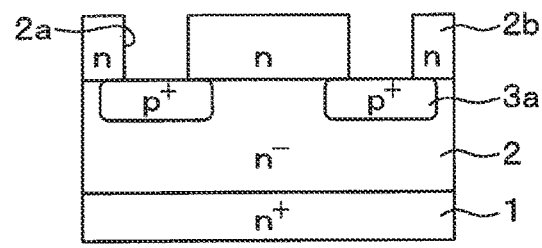
Figure 9E:
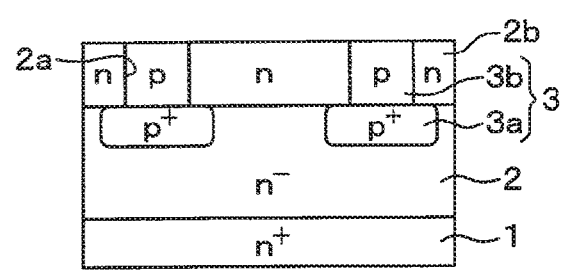
Figure 10A:
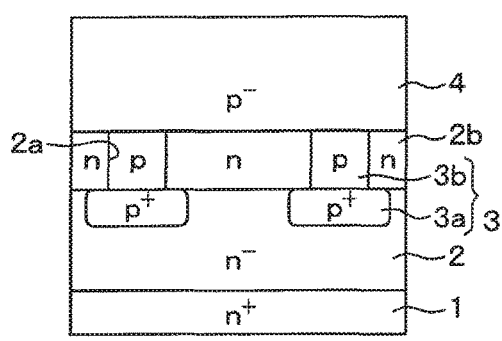
Figure 10D:
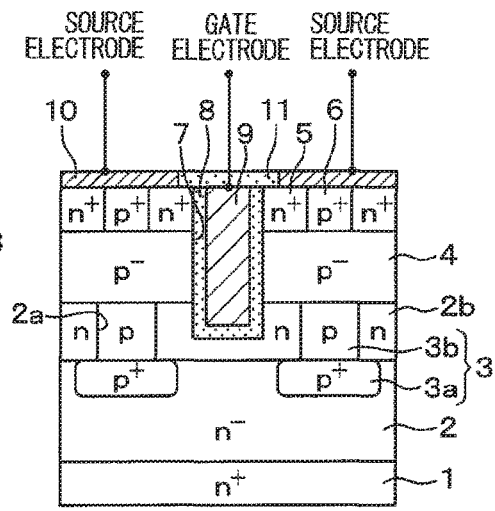
Figure 10B:
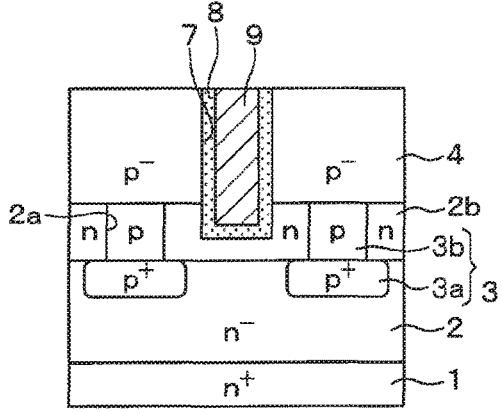
Figure 10E:
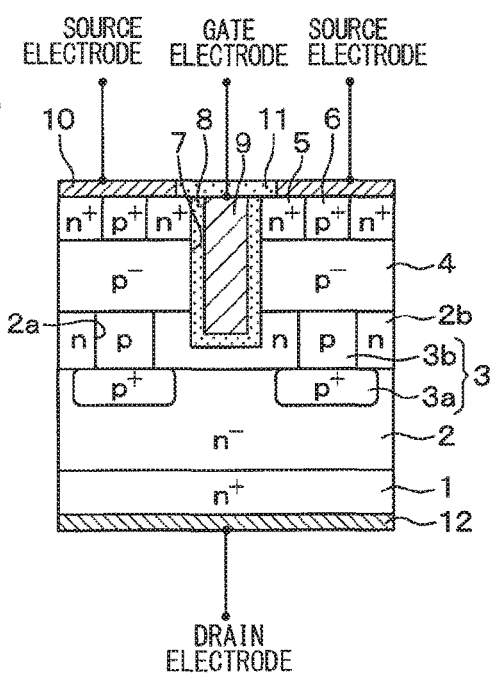
Figure 10C:
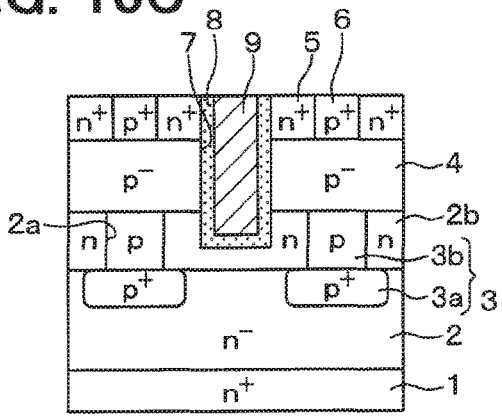

Subsequently, in a process illustrated in FIG. 9C, the high concentration layers 2b to be the remainder of the n-type drift layer 2 are epitaxially grown on partial surfaces of the high concentration regions 3a and the n-type drift layer 2. Further, in a process illustrated in FIG. 9D, with the execution of the same process as that in FIG. 2B, the concave portions 2a are formed in the respective high concentration layers 2b. Thereafter, in a process illustrated in FIG. 9E, the same process as that in FIG. 2D is performed to form low concentration regions 3b.

Thereafter, in processes illustrated in FIGS. 10A to 10E, the same processes as those in FIGS. 2E and 3A to 3D are performed to complete the vertical MOSFET illustrated in FIG. 8.

Other Embodiments

Figure 11:
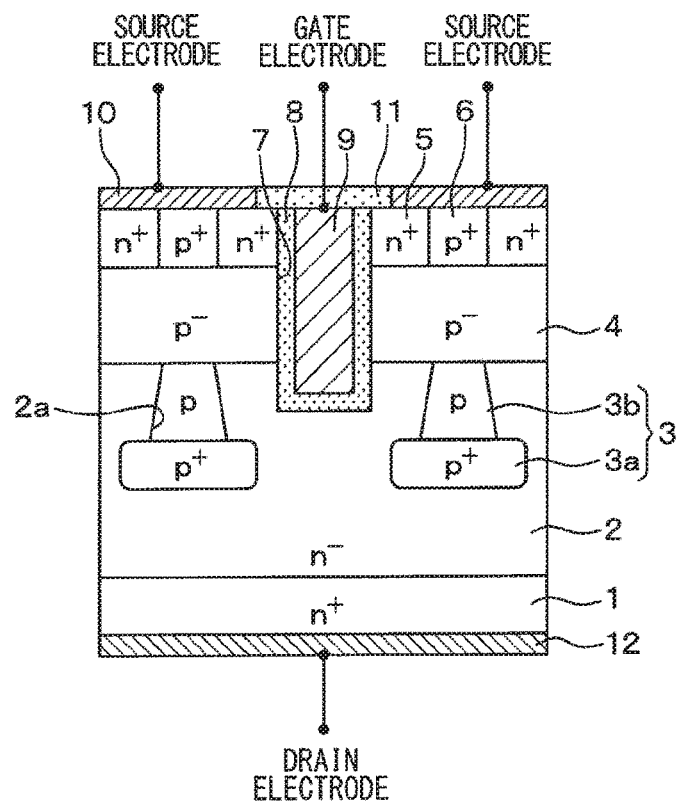
FIG. 11 is a cross-sectional view of an SiC semiconductor device described in another embodiment.
Figure 12:
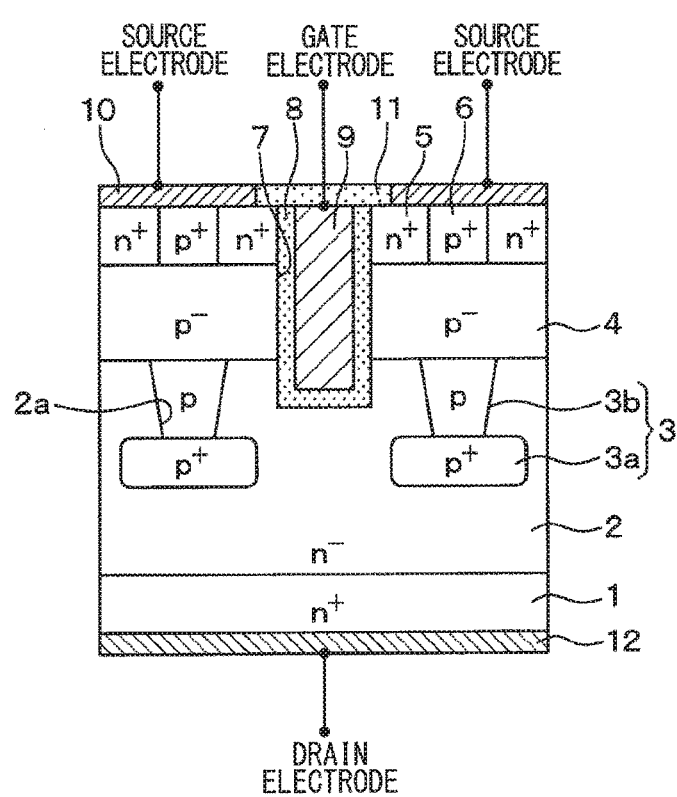
FIG. 12 is a cross-sectional view of an SiC semiconductor device described in another embodiment.

For example, in the respective embodiments described above, the side surfaces of the low concentration regions 3b are illustrated to be in a vertical direction to the surface of the n$^+$ type semiconductor substrate 1. However, the side surfaces of the low concentration regions 3b are not necessarily required to be in the vertical direction. For example, as illustrated in FIG. 11, an upper part of each low concentration region 3b may be set to be smaller in width than a lower part of the low concentration region 3b in a direction parallel to the surface of the n$^+$ type semiconductor substrate 1 to provide a tapered shape in which the side surfaces of the low concentration region 3b are inclined. As illustrated in FIG. 12, the lower part of each low concentration region 3b may be set to be smaller in width than the upper part of the low concentration region 3b in the direction parallel to the surface of the n$^+$ type semiconductor substrate 1 to provide an inversely tapered shape in which the side surfaces of the low concentration region 3b are inclined in a direction opposite to that in FIG. 11.

In order to form the low concentration regions 3b having such shapes, for example, in the case where the low concentration regions 3b are formed by epitaxial growth in the concave portions 2a as in the first and third embodiments, the side surfaces of the concave portions 2a may be tapered or inversely tapered as described above. In order to taper or inversely taper the side surfaces of the concave portions 2a, etching conditions for forming the concave portions 2a may be adjusted.

Figure 13:
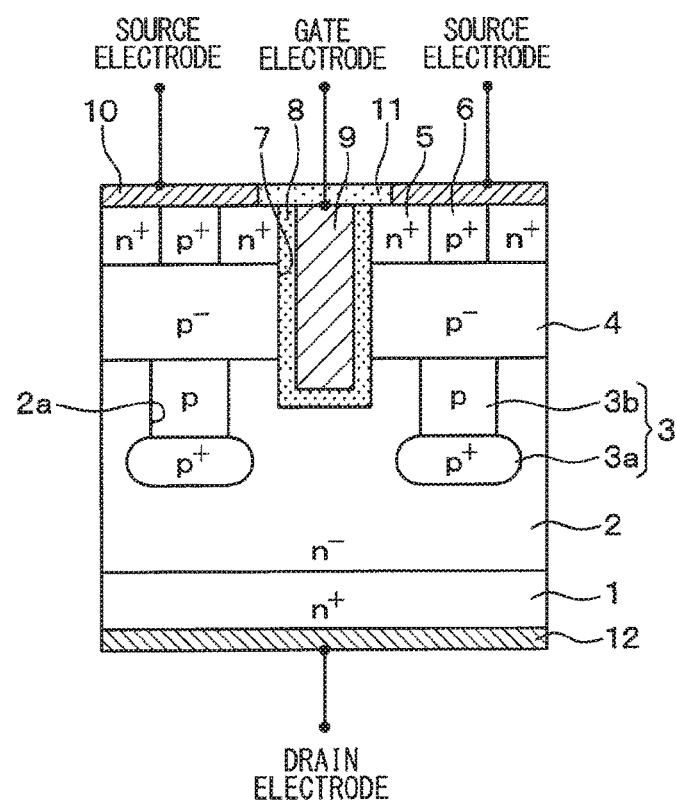
FIG. 13 is a cross-sectional view of an SiC semiconductor device described in another embodiment.

In the case of the shape of the high concentration regions 3a, in the respective embodiments described above, a rectangular shape whose corner portions are rounded in a cross section taken in the direction perpendicular to the longitudinal direction of the trench gate structure is illustrated. Alternatively, as illustrated in FIG. 13, a cross-sectional shape of the high concentration regions 3a may be an oval shape or the like. Further, the impurity concentration of the high concentration regions 3a is not required to be uniform over the entire region, and the impurity concentration may become higher, for example, as the high concentration regions 3a are deeper, in other words, as the high concentration regions 3a come closer to the n$^+$ type semiconductor substrate 1.

Figure 14:
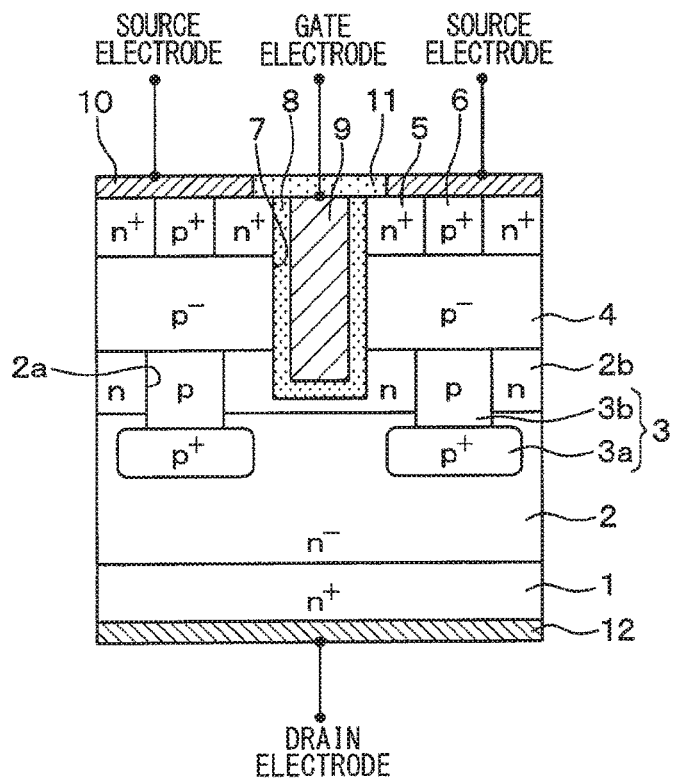
FIG. 14 is a cross-sectional view of an SiC semiconductor device according to another embodiment.
Figure 15:
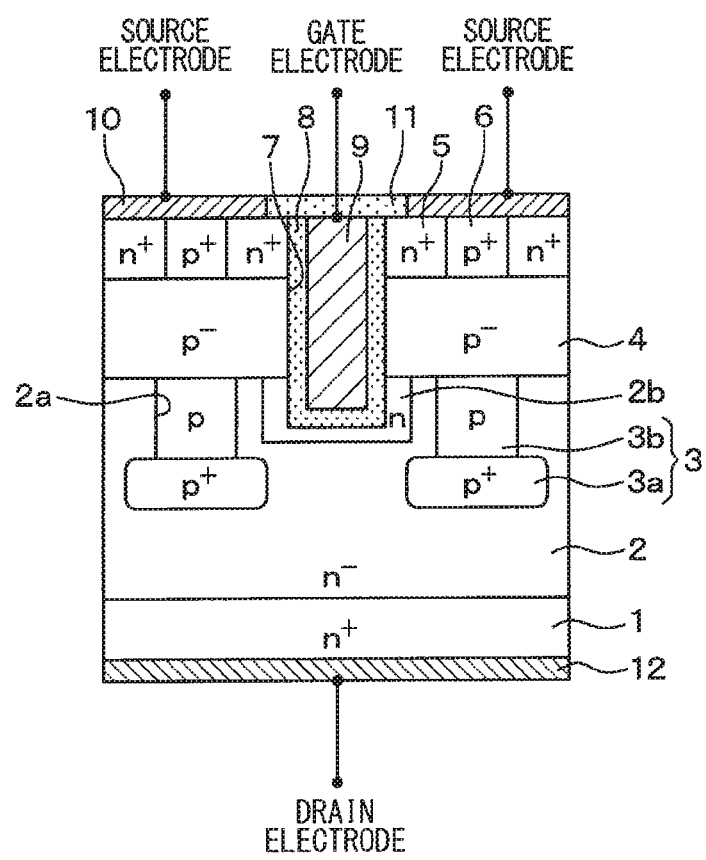
FIG. 15 is a cross-sectional view of an SiC semiconductor device described in another embodiment.

Furthermore, in the fourth embodiment, portions of the n-type drift layer 2 located above the high concentration regions 3a are set as the high concentration layers 2b. The high concentration layers 2b do not need to be formed in an entire region of portions of the n-type drift layer 2 located above the high concentration regions 3a. The high concentration layers 2b may be formed so as to surround at least the bottom portion of the trench gate structure, in more detail, may be formed in a portion to be a current path. For example, each high concentration layer 2b may be formed over an entire region above a position apart from the corresponding high concentration region 3a at a predetermined distance as illustrated in FIG. 14. Alternatively, each high concentration layer 2b may be formed so as to be away from the corresponding high concentration region 3a and the corresponding low concentration region 3b while surrounding the bottom portion of the trench gate structure as illustrated in FIG. 15. In the case of the structure illustrated in FIG. 15, the high concentration layer 1b can be formed by selective epitaxial growth or ion implantation.

Also, in the above respective embodiments, the MOSFET of the n-channel type in which the first conductivity type is n-type, and the second conductivity type is p-type has been described as an example. Alternatively, the present disclosure can be applied to the MOSFET of the p-channel type in which the conductivity type of the respective elements is reversed. Also, in the above description, the MOSFET of the trench gate structure has been described as an example. The present disclosure can be applied to the IGBT having the same trench gate structure. The IGBT changes the conductivity type of the substrate 1 from the n-type to the p-type, and other structures and the manufacturing method are identical with those in the above respective embodiments.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A silicon carbide semiconductor device comprising:
a substrate having a first conductivity type or a second conductivity type and made of silicon carbide;
a drift layer disposed over the substrate, made of silicon carbide, and having the first conductivity type with an impurity concentration lower than the substrate;
a base region disposed over the drift layer, made of silicon carbide, and having the second conductivity type;
a plurality of source regions disposed over an upper layer portion of the base region, made of silicon carbide, and having the first conductivity type with an impurity concentration higher than the drift layer;
a contact region disposed over the upper layer portion of the base region between opposing source regions, made of silicon carbide, and having the second conductivity type with an impurity concentration higher than the base layer;
a plurality of trenches disposed from a surface of each source region to a depth deeper than the base region, and arranged in parallel to each other along one direction as a longitudinal direction;
a gate insulating film arranged on an inner wall of each trench;
a gate electrode arranged on the gate insulating film in each trench;
a source electrode electrically connected to the source regions and the contact region;
a drain electrode arranged over a rear surface of the substrate; and
a plurality of electric field relaxation layers disposed in the drift layer located below the base region, spaced apart from a side of each trench, arranged between adjacent trenches along a direction as a longitudinal direction parallel to the longitudinal direction of the trenches, made of silicon carbide, and having the second conductivity type, wherein:
each of the plurality of electric field relaxation layers includes: a first region that is arranged at a position deeper than the trenches; and a second region that is arranged from a surface of the drift layer to the first region and has a uniform impurity concentration;
a distance between adjacent second regions is defined as W1;
a distance between adjacent first regions is defined as W2;
a relationship of "W1>W2" is satisfied;
a width of a trench gate structure, in which the gate insulating film and the gate electrode are disposed in each of the trenches, is defined as W3; and
a relationship of "W2>W3" is satisfied; and
the second regions have an impurity concentration higher than the base region,
wherein:
a portion of the drift layer that is located above the first region surrounds at least a bottom of a trench gate structure and extends across an entire length of the bottom of the trench gate structure, in which the gate insulating film and the gate electrode are disposed in each of the trenches, is a high impurity concentration layer having the impurity concentration of the first conductivity type impurity higher than a remaining portion of the drift layer, and
the second region has the uniform impurity concentration in a depth direction.

2. The silicon carbide semiconductor device according to claim 1, wherein:
the drift layer has a concave portion at a position corresponding to the second region; and
the second region is an embedded region made of silicon carbide, having the second conductivity type, and embedded in the concave portion.

3. The silicon carbide semiconductor device according to claim 2, wherein:
the first region is an ion implantation region of an impurity having the second conductivity type under a bottom of the concave portion.

4. The silicon carbide semiconductor device according to claim 1, wherein:
each of the first region and the second region is an ion implantation region of an impurity having the second conductivity type in the drift layer; and
the ion implantation region of the second region is provided in a box profile of ion implantation.

5. The silicon carbide semiconductor device according to claim 1, wherein:
a boundary between the high impurity concentration layer and the remaining portion of the drift layer coincides with a boundary between the first region and the second region.

6. The silicon carbide semiconductor device according to claim 1, wherein:
the high impurity concentration layer extends along a longitudinal direction, which is in parallel to the longitudinal direction of the electric field relaxation layers and the longitudinal direction of the trenches.

7. The silicon carbide semiconductor device according to claim 1, wherein:
the high impurity concentration layer is configured to reduce a width of a depletion layer extending into the drift layer; and
the high impurity concentration layer is configured to reduce an internal resistance of the drift layer.

8. The silicon carbide semiconductor device according to claim 1, wherein:
the high impurity concentration layer completely surrounds and extends across an entire width and the entire length of the bottom of each trench.

* * * * *